US007187008B2

(12) United States Patent
Inoue

(10) Patent No.: US 7,187,008 B2
(45) Date of Patent: Mar. 6, 2007

(54) SEMICONDUCTOR DRIVER CIRCUIT, DISPLAY DEVICE AND METHOD OF ADJUSTING BRIGHTNESS BALANCE FOR DISPLAY DEVICE

(75) Inventor: Toshiki Inoue, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 125 days.

(21) Appl. No.: 10/423,408

(22) Filed: Apr. 25, 2003

(65) Prior Publication Data

US 2003/0209721 A1 Nov. 13, 2003

(30) Foreign Application Priority Data

May 7, 2002 (JP) ............................ 2002-132033

(51) Int. Cl.
*H01L 27/15* (2006.01)

(52) U.S. Cl. .................. 257/88; 257/E27.119; 345/77; 345/82

(58) Field of Classification Search .................. 257/40, 257/98, 431–466, 88; 345/76–107
See application file for complete search history.

(56) References Cited

U.S. PATENT DOCUMENTS 4,999,539 A * 3/1991 Coovert et al. ............. 313/505
5,146,213 A 9/1992 Brunel et al. ............... 340/781
5,424,560 A 6/1995 Norman et al. ............... 257/40
5,684,368 A 11/1997 Wei et al. .................... 315/302
6,147,451 A * 11/2000 Shibata et al. .............. 313/506
6,678,028 B2 * 1/2004 Yamate et al. .............. 349/151
6,760,004 B2 * 7/2004 Koyama ...................... 345/98
2003/0067266 A1 * 4/2003 Kim et al. .................. 313/504

FOREIGN PATENT DOCUMENTS

CN 1179586 A 4/1998
JP 07-199210 8/1995
JP 09-152574 6/1997
JP 10-112391 4/1998
JP 2000-137239 5/2000

* cited by examiner

*Primary Examiner*—Marcos D. Pizarro
(74) *Attorney, Agent, or Firm*—Morgan & Finnegan, LLP

(57) ABSTRACT

A semiconductor driver circuit has a plurality of output bumps that are connected to respective electrodes for energizing electroluminescent devices by electric current supplied through the electrodes. The output bumps are arranged in a plurality of output bump rows. Each of the output bump rows includes a plurality of the output bumps.

12 Claims, 4 Drawing Sheets

SEMICONDUCTOR DRIVER CIRCUIT, DISPLAY DEVICE AND METHOD OF ADJUSTING BRIGHTNESS BALANCE FOR DISPLAY DEVICE

BACKGROUND OF THE INVENTION

The present invention relates to a semiconductor driver circuit for driving an electroluminescent device through an electrode and to a display device with the semiconductor driver circuit and further to a method for adjusting brightness balance of a display element in the display device.

A display device with a display element that includes pixels made of electroluminescent devices generally has data electrodes and scanning electrodes. The word of "EL" means "electroluminescent" in the following description. The data electrodes and the scanning electrodes intersect with each other, and the EL device is connected to both the data electrodes and the scanning electrodes at each intersection. For example, the data electrodes are connected to output bumps of a semiconductor data driver circuit.

Now referring to FIG. 6, the diagram illustrates one of a conventional semiconductor data driver circuit 91. The semiconductor data diver 91 includes an input circuit 92. A plurality of constant-current driver circuits 93 is connected to the input circuit 92 through electric wirings, which are not shown in the drawing. Data electrodes 95 are made of transparent material and are located on the visible side of the EL device. The output bumps 94 are arranged in a row near the display element in the semiconductor data driver circuit 91.

An unwanted feature is that, if an image needs to be displayed in high resolution by the display device, the number of pixels in the display element needs to be increased. As the number of pixels increases, the number of data electrodes 95 for driving the pixels also increases. Accordingly, the size of a chip is enlarged so that the cost may rise. To avoid enlarging the size of the chip, a distance between the coadjacent data electrodes 95, that is, a distance between the coadjacent output bumps 94 needs to be shortened. However, when the output bumps 94 are arranged in a single row, the distance between the output bumps 94 cannot be shorter than the width of the constant-current driver circuit 93. The width of the constant-current driver circuit 93 cannot be smaller due to a structure of the circuit 93. This prevents the image from being displayed in high resolution. Therefore, there is a need for a semiconductor driver circuit and a display device that allow a distance between the electrodes to be shortened and also allow the area of a chip to be easily reduced, and in addition there is a need for adjusting brightness balance of a display element in a display device.

SUMMARY OF THE INVENTION

In accordance with the present invention, a semiconductor driver circuit has a plurality of output bumps that are connected to respective electrodes and energizes electroluminescent devices through the electrodes. The output bumps are arranged in a plurality of output bump rows. Each of the output bump rows includes a plurality of output bumps.

The present invention also provides a method for adjusting brightness balance on a display element of a display device. The display element includes electroluminescent devices that are energized by electric current from semiconductor driver circuits through electrodes for displaying a color image. The semiconductor driver circuits include a semiconductor data driver circuit and a semiconductor scanning driver circuit. The electroluminescent devices include a luminous layer and color filters. The semiconductor driver circuits include output bumps that are connected to the respective electrodes. The method includes arranging the output bumps in a plurality of rows on at least one of the semiconductor driver circuits, and adjusting at least one of the conditions for forming the luminous layer and for forming the color filters.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

A first preferred embodiment of the present invention will now be described in reference to FIGS. 1 through 3. The present invention is applied to an organic EL display device that employs a passive matrix drive system in the first preferred embodiment.

Figure 1:
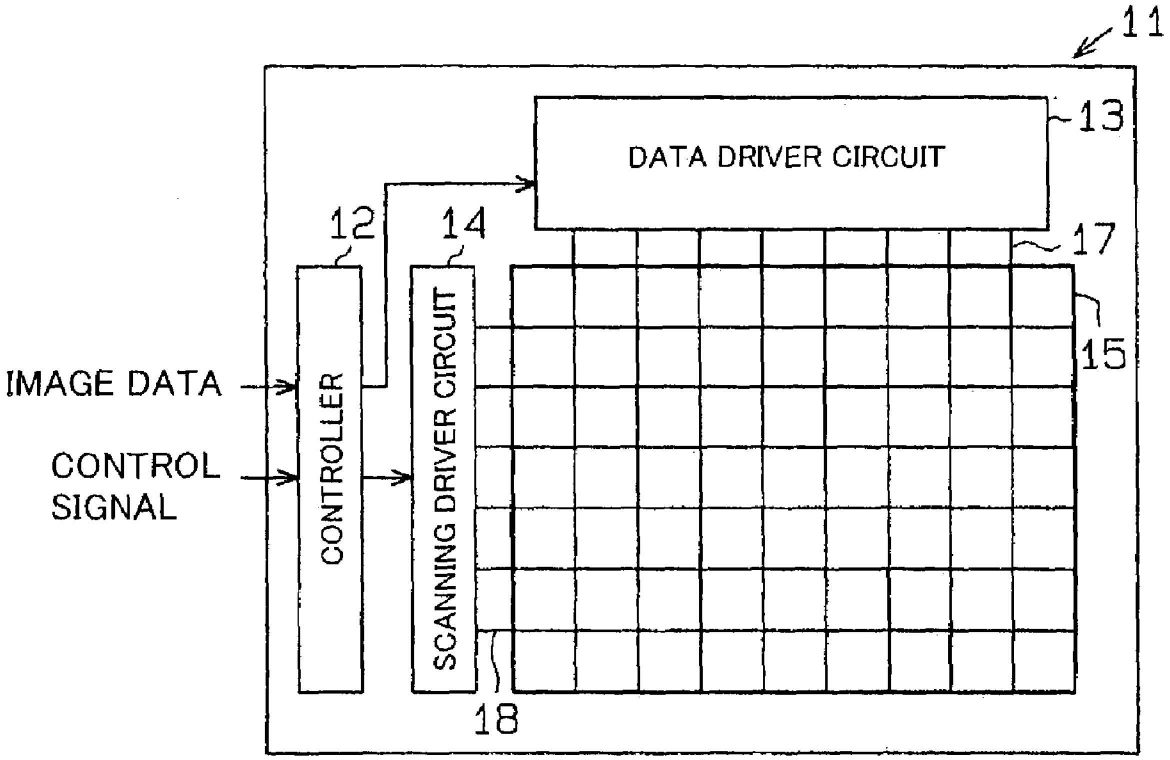
FIG. 1 is a schematic block diagram of an organic EL color display device according to a first preferred embodiment of the present invention.

Now referring to FIG. 1, the diagram illustrates a schematic block diagram of an organic EL color display device 11 according to the first preferred embodiment of the present invention. The organic EL display device 11 includes a controller 12, a data driver circuit or a semiconductor data driver circuit 13, a scanning driver circuit or a semiconductor device for driving scanning 14 and an organic EL panel or a display element 15.

The controller 12 of the organic EL color display device 11 is connected to an external device. Additionally, the controller 12 is connected to the data driver circuit 13 and the scanning driver circuit 14. The controller 12 outputs a display signal for displaying an image to the data driver circuit 13 and the scanning driver circuit 14 based on image data and a control signal from the external device. First electrodes or data electrodes 17 are formed on the organic EL panel 15. Second electrodes or scanning electrodes 18 are formed on the organic EL panel 15. The data driver circuit 13 is connected to the first electrodes 17. The scanning driver circuit 14 is connected to the second electrodes 18.

Figure 2:
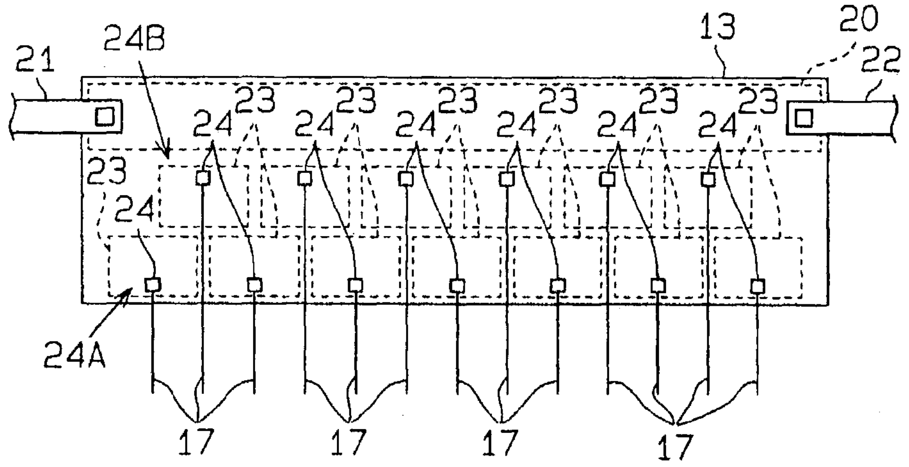
FIG. 2 is a schematic block diagram of a data driver circuit according to the first preferred embodiment of the present invention.

Now referring to FIG. 2, the diagram illustrates a schematic block diagram of the data driver circuit 13 according to the first preferred embodiment of the present invention. An input circuit 20 is provided in the data driver circuit 13. The input circuit 20 is connected to a power supply terminal 21 and a ground terminal 22. The power supply terminal 21 is connected to a power source side, which is not shown in the drawing. The ground terminal 22 is conducted to a ground side. A signal, such as image data, is sent to the input circuit 20 through input bumps and electric wirings, which are not shown in the drawing. Incidentally, these electric wirings are made of material like copper such that the resistance of the electric wirings is little affected by the length of the wirings.

A plurality of constant-current driver circuits 23 is connected to the input circuit 20 through electric wirings, which are not shown in the drawing. All of the constant-current driver circuits 23 have the same shape and the same size. Each of the constant-current driver circuits 23 includes a single output bump 24 that is connected to the first electrode 17. Namely, each of the constant-current driver circuits 23 is connected to the single electrode 17 through the respective output bump 24. The constant-current driver circuits 23 are arranged in the data driver circuit 13 in two rows. In other words, a plurality of the constant-current driver circuits 23 is arranged in each row in the lateral direction of the drawing, and the row of the constant-current driver circuits 23 is formed on the upper side and the lower side in the drawing, respectively. The constant-current driver circuits 23 in each row are positioned at regular intervals in the lateral direction of the drawing.

In the data driver circuit 13, as is the case of the constant-current driver circuit 23, a plurality of the output bumps 24 is arranged in each row in the lateral direction of the drawing, and the row of the output bumps 24 is formed on the upper side and the lower side in the drawing, respectively. In other words, the data driver circuit 13 includes a row of output bumps 24 or an output bump row 24A and a row of output bumps 24 or an output bump row 24B. The output bump row 24A is located near the organic EL panel 15. The output bump row 24B is located on the upper side relative to the output bump row 24A in the drawing. The output bump rows 24A, 24B are arranged parallel with each other. In each of the output bump rows 24A, 24B, the output bumps 24 are positioned at regular intervals in the lateral direction of the drawing. Each output bump 24 in the output bump row 24B is located on the upper side relative to the output bumps 24 in the output bump row 24A and is positioned in the middle of the coadjacent output bumps 24 in the output bump row 24A. Therefore, the first electrodes 17 are positioned at a constant pitch in the lateral direction of the drawing and are alternately connected to the output bumps 24 in the output bump row 24A and in the output bump row 24B. Namely, the first electrode 17 next to the first electrode 17 which is connected to the output bump 24 in the output bump row 24A is connected to the output bump 24 in the output bump row 24B. The pitch of the output bumps 24 is half as large as the pitch of the constant-current driver circuits 23.

Figure 3A:
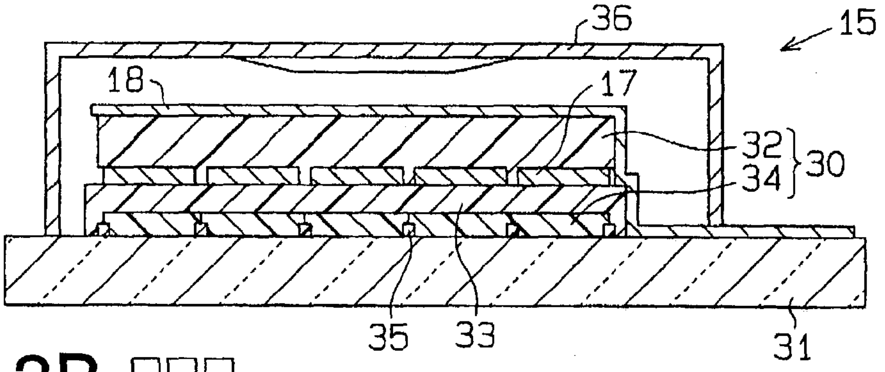
FIG. 3A is a schematic cross-sectional view of an organic EL panel according to the first preferred embodiment of the present invention.

Now referring to FIG. 3A, the diagram illustrates a schematic cross-sectional view of the organic EL panel 15 according to the first preferred embodiment of the present invention. The organic EL panel 15 includes organic electroluminescent devices or organic EL devices 30 that constitute pixels of the organic EL panel 15. As described in FIG. 1, the data driver circuit 13 switches power supply to the organic EL devices 30 for emitting light. The data driver circuit 13 supplies the organic EL devices 30 with electric current that corresponds to the display signal from the constant-current driver circuits 23 through the first electrodes 17. The scanning driver circuit 14 connects the second electrodes 18 with a lower power source, such as a ground. The second electrodes 18 correspond to a display signal or a scanning signal. Thus, the organic EL devices 30 are supplied with electric current corresponding to the display signal.

Still referring to FIG. 3A, the organic EL panel 15 will now be described. The organic EL panel 15 includes a substrate 31 that is made of transparent glass. A plurality of color filters 34 is covered with an overcoat 33. A black mask 35 is interposed between the coadjacent color filters 34. The first electrodes 17, a luminous layer 32 and the second electrodes 18 are layered on the overcoat 33 in this order. The luminous layer 32 and the color filters 34 constitute the organic EL devices 30. An encapsulation cover or an encapsulation can 36 is bonded to the substrate 31 for blocking the luminous layer 32 from being exposed to air.

A plurality of the second electrodes 18 made of metal, such as aluminum, is formed on the luminous layer 32 and forms parallel striped in shape. The second electrodes 18 extend in the lateral direction of the drawing, FIG. 3A. The first electrodes 17 are provided on the lower side of the luminous layer 32 and extend in the direction perpendicular to the second electrodes 18. The first electrodes 17 are made of transparent material, such as indium tin oxide or ITO, to permit the emission of the luminous layer 32 to penetrate the first electrodes 17. The luminous layer 32 is made of organic compound and emits white light.

Figure 3B:
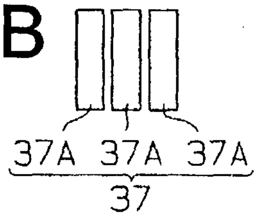
FIG. 3B is a schematic view of a pixel according to the first preferred embodiment of the present invention.

Now referring to FIG. 3B, the diagram illustrates a schematic view of a pixel 37 according to the first preferred embodiment of the present invention. Each of the pixels 37 includes three sub pixels 37A. The first and second electrodes 17, 18 of FIG. 3A intersect with each other, as described before, and each intersection is formed to correspond with each of the sub pixels 37A. Namely, each organic EL device 30 at the intersection corresponds to each of the sub pixels 37A. Each of the sub pixels 37A corresponds to R (red), G (green), and B (blue) in the color filters 34 of FIG. 3A. In the first preferred embodiment, the sub pixel 37A on the left side corresponds to the R, the sub pixel 37A on the middle corresponds to the G and the sub pixel 37A on the right side corresponds to the B in the drawing.

Referring back to FIG. 2, the output bump rows 24A, 24B of the data driver circuit 13 are arranged parallel with the second electrodes 18. Namely, the distance between the output bump row 24B and the second electrodes 18 is longer than the distance between the output bump row 24A and the second electrodes 18 at a certain distance difference. The distance difference is the distance between the output bump row 24A and the output bump row 24B in the upper and lower direction of FIG. 3. Since ITO that has a relatively high electric resistance is used for the first electrode 17 and since the organic EL devices 30 are connected to the different output bump rows 24A, 24B, the distance difference causes imbalanced brightness between the organic El devices 30.

In the organic EL color display device 11 according to the first preferred embodiment, to correct the imbalanced brightness, the outputs of the constant-current driver circuits 23 are adjusted to maintain an appropriate balance of the magnitude of electrical charge between the organic EL devices 30 connected to the output bump row 24A and the organic EL devices 30 connected to the output bump row 24B. The above correction is controlled by the controller 12. In other words, the controller 12 controls the same image data in such a manner that the magnitude of voltage of the display signal sent to the constant-current driver circuit 23 on the side of the output bump row 24B exceeds that on the side of the output bump row 24A. The controller 12 includes means for correcting brightness balance.

The operation of the organic EL color display device 11 will now be described. Referring to FIGS. 1 through 3B, the controller 12 outputs the display signal to the data driver circuit 13 and the scanning driver circuit 14 based on the image data and the control signal from the external device. As the constant-current driver circuit 23 supplies the first electrode 17 with electric current based on the display signal from the controller 12, the luminous layer 32 corresponding to the energized sub pixel 37A emits white light at certain brightness corresponding to an electric potential difference between the first and second electrodes 17, 18. Then, the white light from the luminous layer 32 penetrates the color filter 34 and goes out from the side of the substrate 31. After the white light penetrates one of the predetermined R, G or B color in the color filter 34, the light has a corresponding color. The combination of these colors R, G, B makes a desired color or an image.

At the same time the controller or the means for correcting the brightness balance 12 corrects the imbalanced brightness among the organic EL devices 30 due to the difference of the output bump row (24A or 24B) to which the organic EL devices 30 are connected. As a result, the image is satisfactory displayed.

According to the first preferred embodiment, the following advantageous effects are obtained.

(1) In the data driver circuit 13, the output bumps 24 are arranged in a plurality of the output bump rows 24A, 24B. In comparison to a data driver circuit that provides a single row of output bumps, a distance between the electrodes that are connected to the output bumps is reduced so that the image is displayed in high resolution by the organic EL devices in the first preferred embodiment.

(2) The means for correcting the brightness balance is provided for correcting the imbalanced brightness among the organic EL devices 30 due to the difference of the output bump row (24A or 24B) to which the organic EL devices 30 are connected. Accordingly, the imbalanced brightness among the organic EL devices 30 of the organic EL panel 15 is corrected even if a plurality of the output bump rows 24A, 24B is formed.

(3) A plurality of the output bump rows 24A, 24B each includes a plurality of the output bumps 24 that are positioned in line. In addition, the output bump rows 24A, 24B are arranged parallel with each other. Accordingly, both the output bump rows 24A, 24B are arranged parallel with the second electrodes 18 so that the distances between the output bump rows 24A, 24B and the second electrodes 18 are respectively constant along a direction in which the second electrodes 18 extend. Namely, the distance difference between the output bump row 24A and the output bump row 24B is constant along the direction in which the second electrodes 18 extend. As a result, the controller or the means for correcting the brightness balance 12 easily corrects the imbalanced brightness between the organic EL devices 30 due to the distance difference between the output bump rows 24A, 24B.

(4) The two output bump rows 24A, 24B are arranged parallel with each other. For example, in a data driver circuit that provides a plurality of data bump rows, the size of the data driver circuit is reduced in the direction in which the output bump rows are arranged.

(5) The first electrodes 17 are made of transparent material, such as ITO. Since the transparent material, such as ITO, has a property of relatively high electric resistance, the imbalanced brightness among the organic EL devices 30 due to the difference of the output bump row (24A or 24B) to which the organic EL devices 30 are connected. Namely, the present invention is applied to the organic EL color display device 11 that includes the first electrodes 17 made of transparent material, such as ITO, so that it is appropriate for displaying the satisfactory image.

A second preferred embodiment of the present invention will now be described in reference to FIG. 4. The structure of the means for correcting the brightness balance in the first preferred embodiment is modified in the second preferred embodiment. The other components are substantially identical to those in the first preferred embodiment. The same reference numerals denote the substantially identical components to those in the first preferred embodiment, and the description is omitted.

Figure 4:
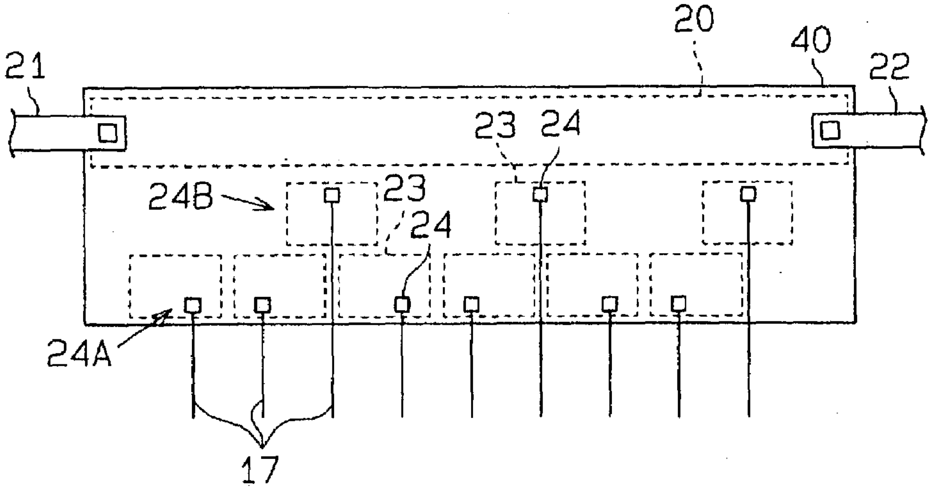
FIG. 4 is a schematic block diagram of a data driver circuit according to a second preferred embodiment of the present invention.

Now referring to FIG. 4, the diagram illustrates a schematic block diagram of a data driver circuit 40 according to the second preferred embodiment of the present invention. The data driver circuit 13 in the first preferred embodiment is replaced by the data driver circuit 40. The data driver circuit 40 includes the input circuit 20, the power supply terminal 21 and the ground terminal 22.

The constant-current driver circuits 23 are connected to the input circuit 20 through the electric wirings, which are not shown in the drawing. The constant-current driver circuits 23 are arranged in two rows. Meanwhile, the color filters 34 include the R, G and B as described in FIG. 3A. One of the rows includes a plurality of the constant-current driver circuits 23 that correspond to one of the R or G in the color filters 34, and the other includes a plurality of the constant-current driver circuits 23 that correspond to the B in the color filters 34. Namely, the output bumps 24 are arranged to form the output bump row 24A and the output bump row 24B. The output bump row 24A includes a plurality of the output bumps 24 corresponding to the R or G. The output bump row 24B includes a plurality of the output bumps 24 corresponding to the B. Accordingly, in the second preferred embodiment, the output bumps 24 corresponding to the B are located farther from the second electrode 18 than the output bumps 24 corresponding to the R or G. Incidentally, the first electrodes 17 connected to the output bumps 24 periodically correspond to the R, G, B in this order from the left side to the right side of the drawing.

In the second preferred embodiment, the controller 12 does not correct the imbalanced brightness, which is different from the controller 12 in the first preferred embodiment. Since the output bumps 24 corresponding to the B are located farther from the second electrodes 18 than the output bumps 24 corresponding to the R or G, the portion of luminous layer 32 corresponding to the B is lower in brightness than that corresponding to the R and G. Then, in the second preferred embodiment, the imbalanced brightness among the organic EL devices 30 is corrected by adjusting the color depth of the color filter 34. In other words, the color depth of the B in the color filter 34 is lighter than that of the R and G. Incidentally, instead of adjusting the color depth of the color filter 34 itself, the color filters 34 corresponding to the B may be formed relatively thin, or the color filters 34 may include different materials for adjusting light transmittance. In the second preferred embodiment, the color filters 34 function as the means for correcting the brightness balance.

According to the second preferred embodiment, in addition to the advantageous effects mentioned in the paragraphs (1) through (5) in the first preferred embodiment, the following advantageous effects are obtained.

(6) The output bumps 24 corresponding to the respective colors of R, G, B in the organic EL devices 30 are respectively arranged in the same output bump rows 24A and 24B. That is, the output bumps 24 corresponding to the colors of R and G are arranged in the output bump row 24A, and the output bumps 24 corresponding to the color of B are arranged in the output bump row 24B. Accordingly, a distance between the output bumps 24 and the second electrodes 18 becomes constant for every color. Namely, the imbalanced brightness among the organic EL devices 30 in the organic El panel 15 is optionally corrected by independently correcting the brightness of each color. Therefore, the structure of the means for correcting the brightness balance may be simple.

(7) The imbalanced brightness among the organic EL devices 30 is corrected by adjusting the conditions for forming the color filter 34, that is, the color depth of the color filter 34 itself, the thickness of the color filter 34 or changing the light transmittance by using different materials. Accordingly, for example, in comparison to a structure that corrects the brightness balance by adjusting electric current supplied to the organic EL devices 30, a control circuit for adjusting the supplied current is not required so that complicated control is not required in the second preferred embodiment.

A third preferred embodiment of the present invention will now be described in reference to FIG. 5. The structure of the data driver circuit and the like in the second preferred embodiment are modified in the third preferred embodiment. The other components are substantially identical to those in the second preferred embodiment. The same reference numerals denote the substantially identical components to those in the second preferred embodiment, and the description is omitted.

Figure 5:
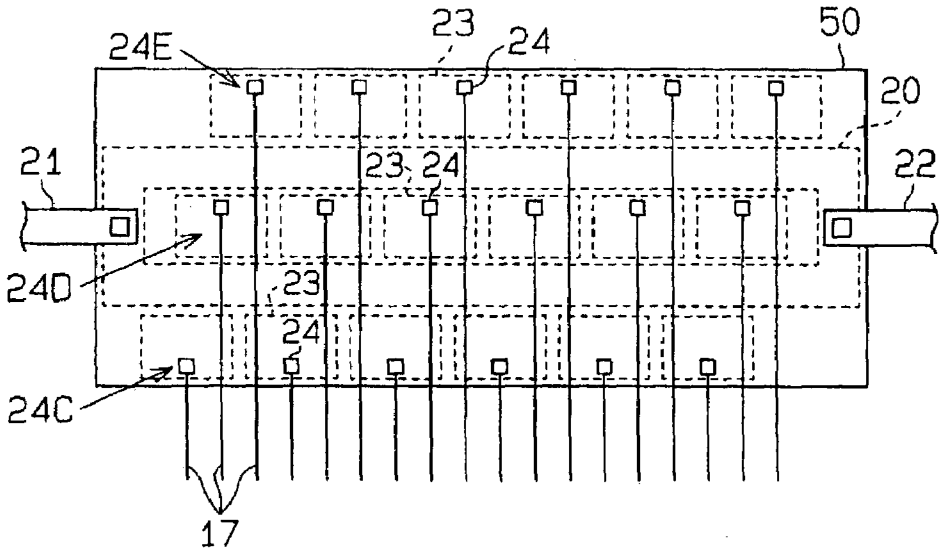
FIG. 5 is a schematic block diagram of a data driver circuit according to a third preferred embodiment of the present invention.
Figure 6:
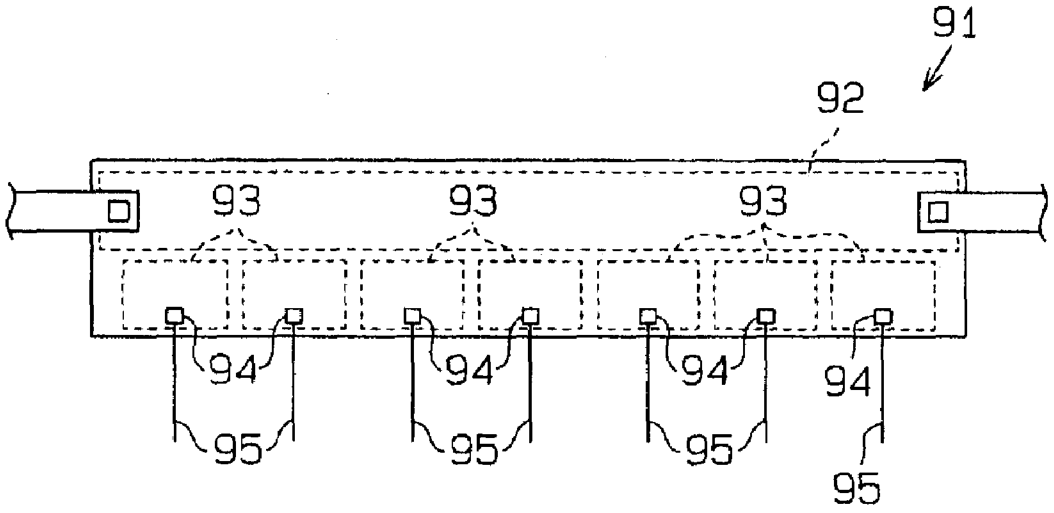
FIG. 6 (PRIOR ART)
FIG. 6 is a schematic block diagram of a semiconductor data driver circuit according to a prior art.

Now referring to FIG. 5, the diagram illustrates a schematic block diagram of a data driver circuit 50 according to the third preferred embodiment of the present invention. The data driver circuit 40 in the second preferred embodiment is replaced by the data driver circuit 50 in the third preferred embodiment. The data driver circuit 50 includes the input circuit 20, the power supply terminal 21 and the ground terminal 22, as well as the data driver circuit 40.

In the third preferred embodiment, the constant-current driver circuits 23 are connected to the input circuit 20 through the electric wiring, which is not shown in the drawing. The constant-current driver circuits 23 form three rows of a plurality of the constant-current driver circuits 23, and each of the rows corresponds to the color of R, G or B of the color filter 34. Namely, the output bumps 24 are arranged in the three rows, that is, an output bump row 24C, an output bump row 24D and an output bump row 24E. The output bump row 24C includes a plurality of the output bumps 24 corresponding to the R. The output bump row 24D includes a plurality of the output bumps corresponding to the G. The output bump row 24E includes a plurality of the output bumps corresponding to the B.

In the data driver circuit 50, the output bump rows 24C, 24D, 24E are arranged in this order from the side of the organic EL panel 15 toward the upper side of the drawing. Each of the output bump rows 24C, 24D, 24E is arranged parallel with the second electrodes 18 of FIG. 1. Accordingly, in the third preferred embodiment, the output bumps 24 corresponding to the G is located farther from the second electrode 18 than the output bumps 24 corresponding to the R. The output bumps 24 corresponding to the B are located much farther from the second electrode 18 than the output bumps 24 corresponding to the G. Incidentally, the first electrodes 17 connected to the respective output bumps 24 periodically correspond to the R, G, B from the left side to the right side of the drawing.

In the third preferred embodiment, as well as the second preferred embodiment, the imbalanced brightness among the organic EL devices 30 is corrected by adjusting the color depth of the color filter 34. In other words, the depth of the color of the G is lighter than that of the R in the color filter 34. The color depth of the B is much lighter than that of the G in the color filter 34. Incidentally, as well as the second preferred embodiment, other than adjusting the color depth of the color filter 34 itself, the thickness of color filter 34 may be determined for every color or the color filters 34 may include different materials for adjusting light transmittance.

According to the third preferred embodiment, in addition to the paragraphs (1) through (3) and (5) through (7) mentioned in the above first and second preferred embodiments, the following advantageous effect is obtained.

(8) The output bump rows 24C, 24D, 24E are arranged in three rows. Accordingly, for example, in comparison to a data driver circuit that includes two output bump rows, the distance between the two coadjacent first electrodes 17 is further shortened.

The present invention is not limited to the embodiments described above but may be modified into the following alternative embodiments.

In alternative embodiments to the above second and third preferred embodiments, instead of correcting the imbalanced brightness by adjusting the conditions for forming the color filter 34, the imbalanced brightness is corrected by adjusting the conditions for forming the luminous layer 32. In this state, as for the adjustment for forming the luminous layer 32, for example, the amount of dopant in the luminous layer 32 is adjusted for relatively increasing the color B (blue) component in the emitted light in the second preferred embodiment. In addition, for example, the amount of dopant in the luminous layer 32 is adjusted for relatively increasing the color G (green) component and the color B (blue) component in the emitted light in the third preferred embodiment.

In alternative embodiments to the above first preferred embodiment, instead of correcting the imbalanced brightness in such a manner that the controller 12 controls the constant-current driver circuit 23, the imbalanced brightness is corrected by adjusting the conditions for forming the color filter 34 or the luminous layer 32.

In alternative embodiments to the above second and third preferred embodiments, instead of correcting the imbalanced brightness by adjusting the conditions for forming the color filter 34, the imbalanced brightness is corrected in such a manner that the controller 12 controls the constant-current driver circuit 23.

In alternative embodiments to the above preferred embodiments, the control by the controller 12 includes pulse width modulation (PWM) control and PHM control.

In alternative embodiments to the above preferred embodiments, the constant-current driver circuit 23 is replaced by a constant-voltage drive circuit.

In alternative embodiments to the above preferred embodiments, the imbalanced brightness is not corrected. Also, the means for correcting the brightness balance is omitted.

In alternative embodiments to the above preferred embodiments, instead of the color filters 34 that are constituted of the color R, G, B or three primary colors of light, the color filters 34 are constituted of three colors other than the above three primary colors.

In alternative embodiments to the above preferred embodiments, the color filters 34 are not limited to be constituted of three colors. For example, the color filter 34 may be constituted of two colors or four colors.

In alternative embodiments to the above preferred embodiments, the organic EL panel 15 is used for monochrome display.

In alternative embodiments to the above preferred embodiments, the luminous layer 32 is not limited to a white luminous layer. A luminous layer having a single emission spectrum, such as a blue luminous layer, is applicable. In this state, a color conversion filter or a color filter is employed for converting the wavelength of the emission spectrum of the luminous layer 32 to that of the spectrum of red or green.

In alternative embodiments to the above preferred embodiments, the luminous layer 32 is a multi-color luminous layer for optionally changing display color without any color filter. In this state, for example, the portions of luminous layer 32 corresponding to the sub pixels 37A respectively emit the light of R (red), G (green), B (blue). Incidentally, luminescent colors corresponding to the sub pixels 37A of luminous layer 32 are not limited to the R, G and B and are not limited to three colors. Namely, the number of sub pixels 37A constituting the pixel 37 is not limited to three.

In alternative embodiments to the above preferred embodiments, an inorganic EL device is used instead of the organic EL device.

In alternative embodiments to the above preferred embodiments, the second electrode 18 is not limited to be made of transparent material.

In alternative embodiments to the above preferred embodiments, instead of the organic EL panel 15 that emits light from the side of the substrate 31, an organic EL panel that emits light from the side of an encapsulation cover. In this state, the organic EL panel includes a transparent encapsulation cover and a color filter that is interposed between the encapsulation cover and a luminous layer. Additionally, an electrode between the encapsulation cover and the luminous layer is transparent.

In alternative embodiments to the above preferred embodiments, the output bump rows 24A, 24B, 24C, 24D, 24E are not limited to be arranged parallel with each other.

In alternative embodiments to the above preferred embodiments, in each of the output bump rows 24A, 24B, 24C, 24D, 24E, the output bumps 24 are not limited to be positioned in-line.

In alternative embodiments to the above preferred embodiments, the data driver circuit includes four or above number of output bump rows.

In alternative embodiments to the above preferred embodiments, the output bumps 24 corresponding to the respective colors, such as the R, G, B, of the organic EL device are not limited to be arranged in the same output bump rows 24A, 24B, 24C, 24D, 24E.

In alternative embodiments to the above preferred embodiments, instead of the driving semiconductor device that is embodied as the data driver circuit 13 connected to the first electrode 17, the driving semiconductor device is embodied as the scanning driver circuit 14 connected to the second electrode 18.

Therefore, the present examples and embodiments are to be considered as illustrative and not restrictive, and the invention is not to be limited to the details given herein but may be modified within the scope of the appended claims.

What is claimed is:

1. A display device comprising:

a semiconductor data driver circuit including output bumps, a semiconductor scanning driver circuit;

a data electrode connected to one of the output bumps of the semiconductor data driver circuit;

a scanning electrode connected to the semiconductor scanning driver circuit, the scanning electrode intersecting with the data electrode;

a display element including electroluminescent devices that have a luminous layer, the electroluminescent devices being connected at a portion where the data and scanning electrodes intersect with each other; and a plurality of constant-current driver circuits positioned within the semiconductor data driver circuit to form a plurality of constant-current driver circuit rows, each of the constant-current driver circuit rows including a plurality of the constant-current driver circuits, wherein each constant-current driver circuit includes the output bump, wherein the constant-current driver circuits are connected to the data electrodes through the output bumps, respectively, wherein the output bumps are positioned within the semiconductor data driver circuit to form a plurality of output bump rows, each of the output bump rows including a plurality of the output bumps.

2. The semiconductor driver circuit according to claim 1, wherein a plurality of the output bump rows are arranged parallel with each other.

3. The semiconductor driver circuit according to claim 1, wherein the number of output bump rows is two.

4. The semiconductor driver circuit according to claim 1, wherein the output bumps are positioned at regular intervals.

5. A semiconductor driver circuit for energizing an electroluminescent device through electrodes, comprising:

a plurality of constant-current driver circuits positioned within the semiconductor driver circuit to form a plurality of constant-current driver circuit rows, each of the constant-current driver circuit rows including a plurality of the constant-current driver circuits, wherein each constant-current driver circuit includes an output bump that is connected to a respective electrode, wherein the constant-current driver circuits are connected to the electrodes through the output bumps, respectively, wherein the output bumps are arranged in a plurality of output bump rows, each of the output bump rows including a plurality of the output bumps.

6. The semiconductor driver circuit according to claim 5, wherein the output bumps are positioned in line in the respective output bump rows, a plurality of the output bump rows being arranged parallel with each other.

7. The semiconductor driver circuit according to claim 5, wherein the number of output bump rows is two.

8. The semiconductor driver circuit according to claim 5, wherein the output bumps are positioned at regular intervals.

9. A display device comprising:

a semiconductor data driver circuit including a plurality of constant-current driver circuits, wherein each constant-current driver circuit includes an output bump;

a semiconductor scanning driver circuit, wherein the output bumps positioned within the semiconductor data driver circuit form a plurality of output bump rows, each of the output bump rows including a plurality of the output bumps that are positioned in line;

a data electrode connected to the output bump of the semiconductor data driver circuit;

a scanning electrode connected to the semiconductor scanning driver circuit, the scanning electrode intersecting with the data electrode; and a display element including electroluminescent devices that have a luminous layer, the electroluminescent devices being connected at a portion where the data and scanning electrodes intersect with each other.

10. The semiconductor driver circuit according to claim 9, wherein a plurality of the output bump rows are arranged parallel with each other.

11. The semiconductor driver circuit according to claim 9, wherein the number of output bump rows is two.

12. The semiconductor driver circuit according to claim 9, wherein the output bumps are positioned at regular intervals.

* * * * *